(12) United States Patent  (10) Patent No.: US 8,956,954 B2
Chen                                        (45) Date of Patent:      Feb. 17, 2015

(54) METHOD OF PROCESSING WAFERS FOR SAVING MATERIAL AND PROTECTING ENVIRONMENT

(76) Inventor: Chih-Hao Chen, Hsinchu (TW)

(*) Notice: Subject to any disclaimer, the term of this patent is extended or adjusted under 35 U.S.C. 154(b) by 261 days.

(21) Appl. No.: 13/400,587

(22) Filed: Feb. 21, 2012

(65) Prior Publication Data

US 2013/0217208 A1      Aug. 22, 2013

(51) Int. Cl.
    *H01L 21/78*   (2006.01)
(52) U.S. Cl.
    USPC .................................. 438/460; 257/E21.599
(58) Field of Classification Search
    None
    See application file for complete search history.

(56) References Cited

U.S. PATENT DOCUMENTS

| | | | | |
|---|---|---|---|---|
| 5,622,875 | A * | 4/1997 | Lawrence | 438/691 |
| 6,338,980 | B1 * | 1/2002 | Satoh | 438/106 |
| 7,775,856 | B2 * | 8/2010 | Bhatnagar et al. | 451/38 |
| 2001/0018242 | A1 * | 8/2001 | Kramer et al. | 438/200 |
| 2002/0070302 | A1 * | 6/2002 | Goh | 241/101.2 |
| 2008/0093029 | A1 * | 4/2008 | Liao | 156/584 |
| 2008/0261351 | A1 * | 10/2008 | Peng | 438/113 |
| 2009/0104750 | A1 * | 4/2009 | Yamazaki et al. | 438/406 |
| 2009/0291621 | A1 * | 11/2009 | Yamada | 451/44 |
| 2010/0117084 | A1 * | 5/2010 | Konno et al. | 257/48 |
| 2010/0173431 | A1 * | 7/2010 | Okita et al. | 438/4 |
| 2012/0003816 | A1 * | 1/2012 | Shimotani et al. | 438/462 |

* cited by examiner

*Primary Examiner* — Charles Garber
*Assistant Examiner* — Stanetta Isaac
(74) *Attorney, Agent, or Firm* — Leong C. Lei (57) ABSTRACT

A method of processing wafers for saving material and protecting environment is implemented to collect defective or incomplete wafers and perform cutting operation to create a plurality of separate dies. According to the requirement of a specification, the backs of the dies are grinded to allow each die to have a predetermined thickness. Thereafter, the grinded dies with completeness are sequentially placed onto a carrying means. With the method, the defective or incomplete wafers, which would be discarded in general wafer manufacturing, may be reclaimed to go through cutting, grinding, and selecting operations, so that the dies with completeness on the defective wafers can be picked out and processed again, so as to increase the yield, lower the manufacturing cost, reduce the amount of the wafer waste, increase the wafer utilization, and meet the demands of energy saving, carbon reduction, and environmental protection.

18 Claims, 9 Drawing Sheets

METHOD OF PROCESSING WAFERS FOR SAVING MATERIAL AND PROTECTING ENVIRONMENT

(A) TECHNICAL FIELD OF THE INVENTION

The present invention relates to a method of processing wafers and, more particularly to a method of processing wafers for saving material and protecting environment, whereby the defective or incomplete wafers, which would be discarded in general wafer manufacturing, can be reclaimed to go through cutting, grinding, and selecting operations, so that the dies with completeness on the defective wafers can be picked out and processed again, so as to increase the yield, lower the manufacturing cost, reduce the amount of the wafer waste, and meet the demands of energy saving, carbon reduction, and environmental protection.

(B) DESCRIPTION OF THE PRIOR ART

The manufacturing process for integrated circuits or chips is complicated, which involves many processing steps. The process begins with manufacturing a silicon crystal ingot by using a crystal puller for growing the ingot, which is a single crystal structure being started from a perfect silicon crystal seed with supply of a highly refined silicon heated in the furnace of the puller. Thereafter, the ingot is finely sliced into blank wafers, which then goes through a series of processing steps to create patterned wafers.

The patterned wafers should be tested with a wafer tester before entering a packaging process. The objectives of the wafer test is to identify the good dies on the wafer for packaging and to obtain the yield based on the measurement of electrical parameters on the dies. The wafers of low yield are regarded as defective wafers, which will be discarded in general wafer manufacturing. The wafers that have local breakage or uneven thickness, are also regarded as defective or incomplete wafers and will be discarded.

Those defective or incomplete wafers, including the wafers of low yield and the wafers that have local breakage or uneven thickness, will be discarded as waste. Thus, the waste derived from the wafer manufacturing will be increased. Since the wafers are coated with metal layer or other oxides, they can pollute the environment. Thus, there is a need to provide a method to reclaim those defective or incomplete wafers, so as to save wafer material in the manufacturing and reduce the wafer waste for environmental protection.

SUMMARY OF THE INVENTION

The primary object of the present invention is to provide a method of processing wafers for saving material and protecting environment, which can be implemented to collect wafers that have defects, such as slight breakage or fragmentation or low yield, perform cutting operation to create a plurality of separate dies. According to the requirement of a specification, the backs of the dies are grinded to allow each die to have a predetermined thickness. Thereafter, the grinded dies with completeness are sequentially placed onto a carrying means. With the method, the defective wafers, which would be discarded in general wafer manufacturing, may be reclaimed to go through cutting, grinding, and selecting operations, so that the dies with completeness on the defective wafers can be picked out and processed again, so as to increase the yield, lower the manufacturing cost, reduce the amount of the wafer waste, and meet the demands of energy saving, carbon reduction, and environmental protection.

Another object of the present invention is to provide a method of processing wafers for saving material and protecting environment, which can be implemented to collect wafers that have defects, such as slight breakage or fragmentation or low yield, perform partial cutting operation to leave a predetermined thickness for the wafers, thereby creating a plurality of adjoining dies. According to the requirement of a specification, the back of the adjoining dies is grinded to allow each die to have the predetermined thickness. Thereafter, the grinded dies with completeness are sequentially placed onto a carrying means. With the method, the defective wafers, which would be discarded in general wafer manufacturing, may be reclaimed to go through cutting, grinding, and selecting operations, so that the dies with completeness on the defective wafers can be picked out and processed again, so as to increase the yield, lower the manufacturing cost, reduce the amount of the wafer waste, and meet the demands of energy saving, carbon reduction, and environmental protection.

A further object of the present invention is to provide a method of processing wafers for saving material and protecting environment, which can be implemented to collect incomplete wafers that have remaining dies or dies with too much thickness, and place the dies with completeness onto a carrying means. According to the requirement of a specification, the backs of the dies are grinded to allow each die to have a predetermined thickness. Thereafter, the grinded dies with completeness are sequentially placed onto a carrying means. With the method, the incomplete wafers, which would be discarded in general wafer manufacturing, may be reclaimed to go through grinding and selecting operations, so that the dies with completeness on the incomplete wafers can be picked out and processed again, so as to increase the yield, lower the manufacturing cost, reduce the amount of the wafer waste, and meet the demands of energy saving, carbon reduction, and environmental protection.

Other objects, advantages, and novel features of the present invention will become more apparent from the following detailed description when taken in conjunction with the accompanying drawings.

DETAILED DESCRIPTION OF THE PREFERRED EMBODIMENTS

Figure 1:
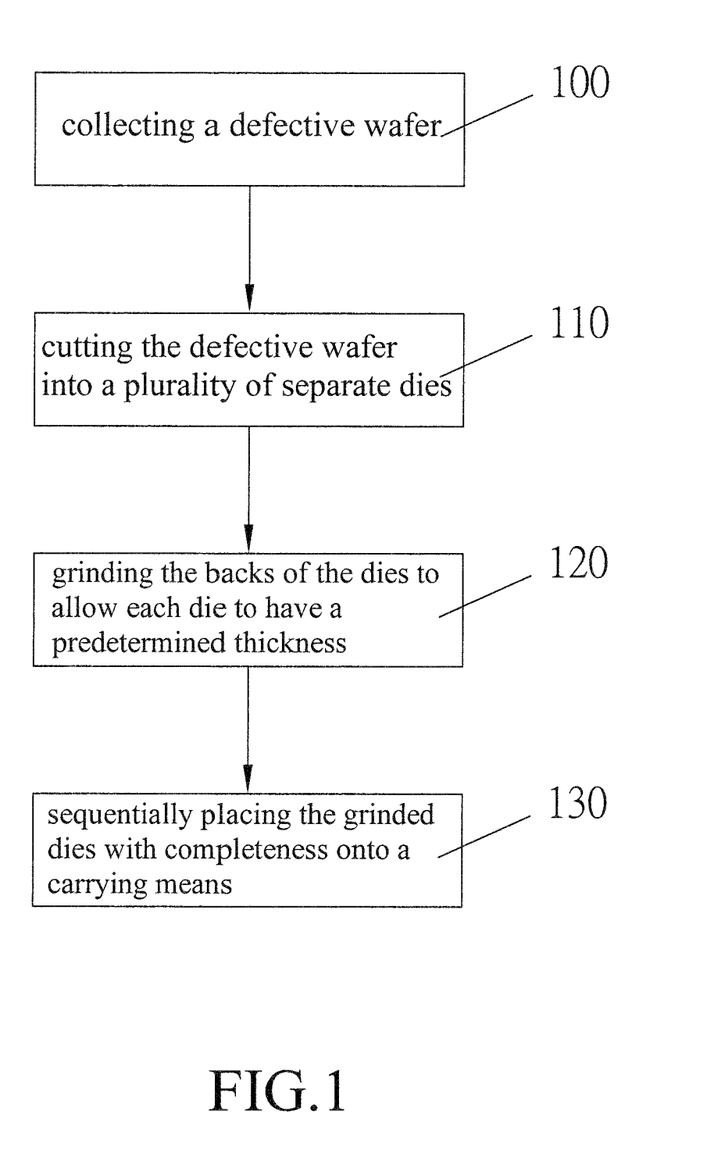
FIG. 1 shows a flowchart of the present invention, which briefs a first method of processing wafers for saving material and protecting environment.
Figure 2:
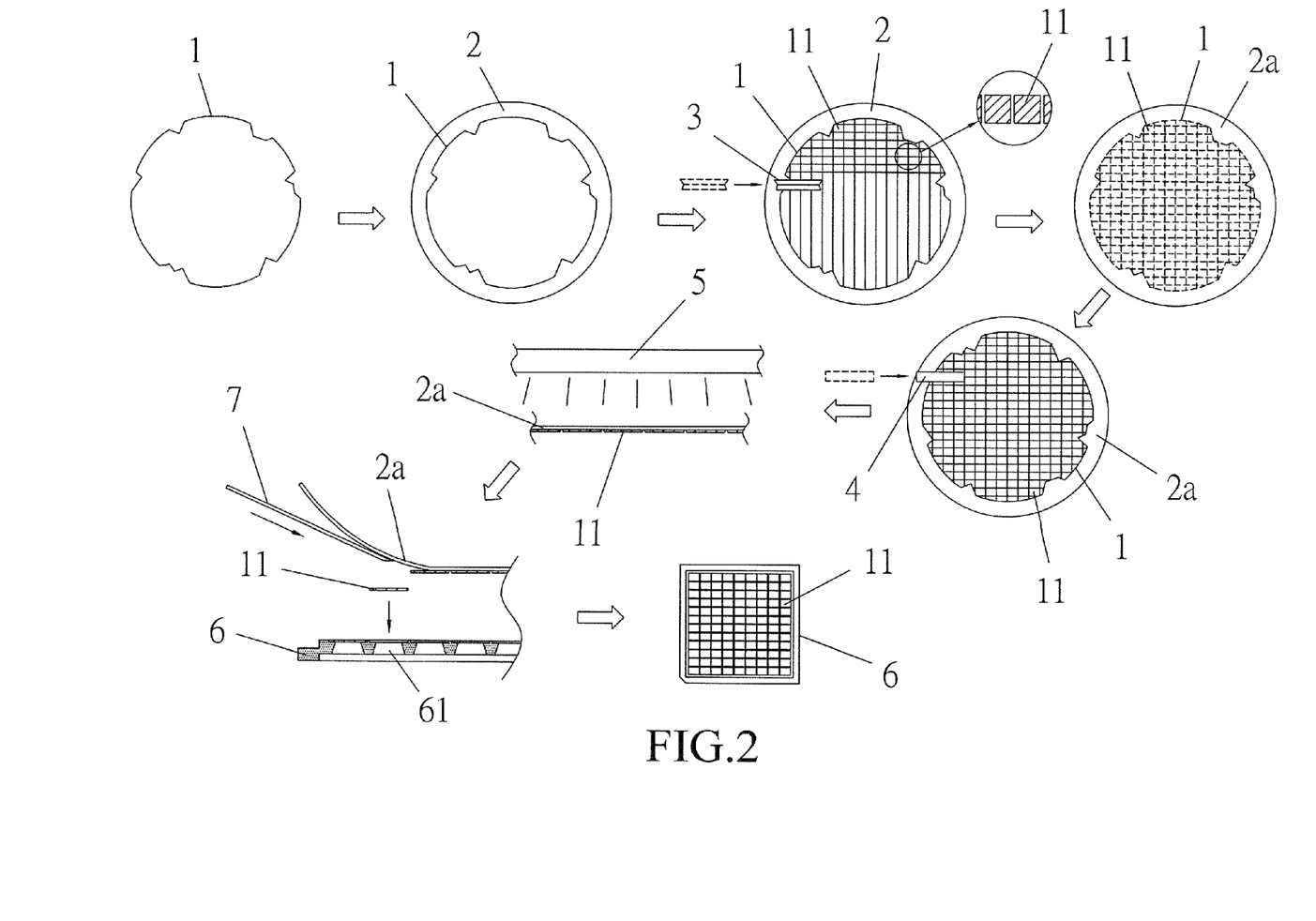
FIG. 2 shows a schematic view illustrating the flowchart in FIG. 1.
Figure 3:
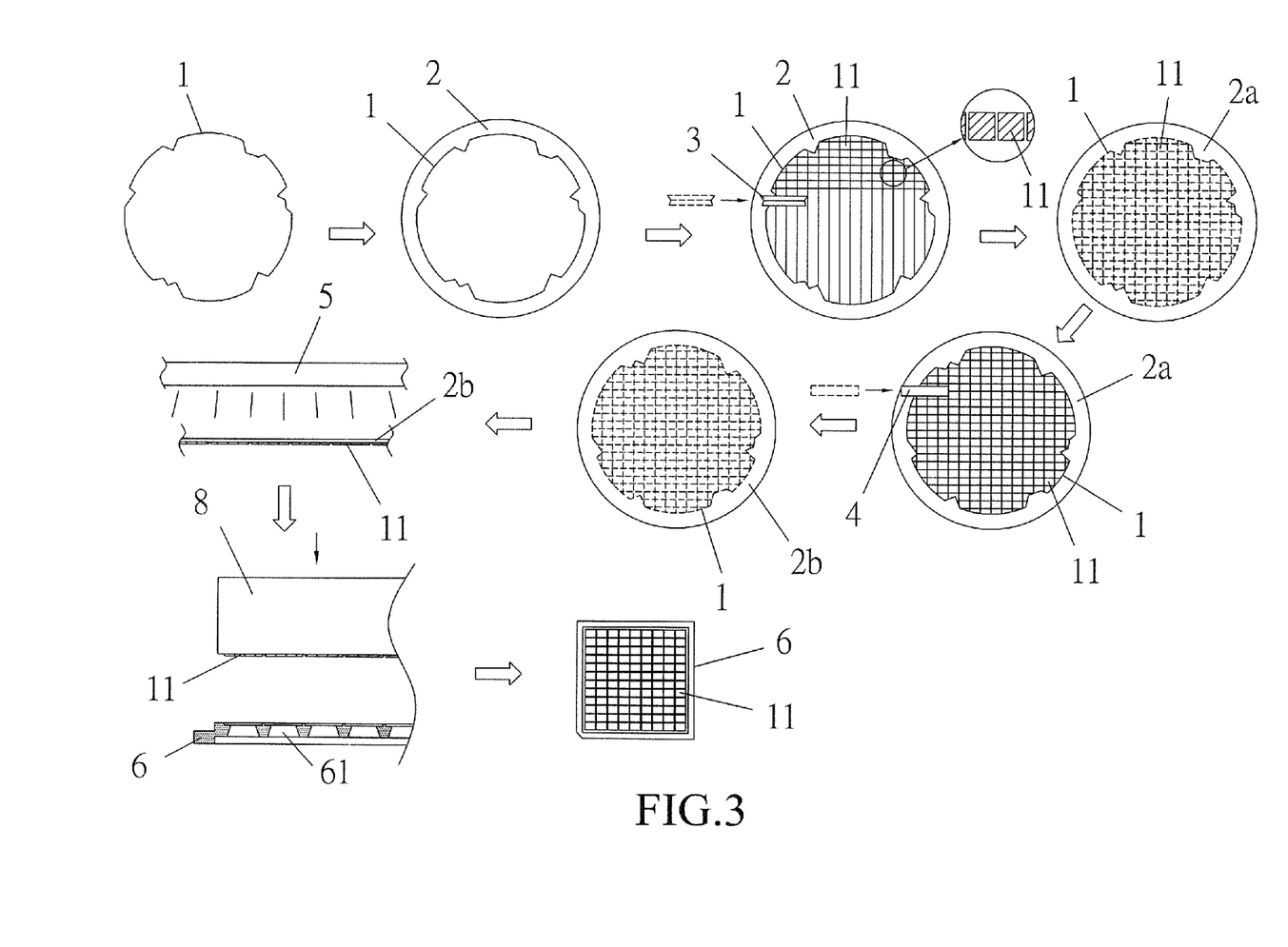
FIG. 3 shows another schematic view illustrating the flowchart in FIG. 1.

Referring to FIGS. 1-3, the present invention discloses a first method of processing wafers for saving material and protecting environment, which generally comprises the following steps:

STEP 100: collecting a wafer 1 which has defects, such as slight breakage or fragmentation, or low yield;

STEP 110: cutting the defective wafer 1 into a plurality of separate dies 11;

STEP 120: grinding the backs of the dies 11 to allow each die to have a predetermined thickness; and STEP 130: sequentially placing the grinded dies 11 with completeness onto a carrying means, such as a carrier 6 with troughs 61.

With the first method of the present invention, the defective wafers 1, which would be discarded in general wafer manufacturing, may be reclaimed to go through a cutting step (as provided by STEP 110), a grinding step (as provided by STEP 120), and a selecting step (as provided by STEP 130), to allow the dies 11 with completeness on the defective wafer 1 to be picked out and processed again, so as to increase the yield, lower the manufacturing cost, reduce the amount of the wafer waste, and meet the demands of energy saving, carbon reduction, and environmental protection.

The following will illustrate the first method of the present invention for a wafer with slight defects (such as a broken wafer) in more detail. First, as shown in FIG. 2, the back of the defective wafer 1 is attached with a first sticky film 2. Then, a dicer 3 is employed to perform horizontal and vertical cutting on the front of the defective wafer 1 so as to create a plurality of separate dies 11. Next, the front of the defective wafer 1 is attached with a second sticky film 2a, and then the defective wafer 1 together with the sticky films is turned over, after which the first sticky film 2 attached to the back of the defective wafer 1 can be removed. Thereafter, according to the requirement of a specification, the backs of the dies 11 are grinded by a grinder 4 to allow each die to have a predetermined thickness. After finishing the grinding, the dies 11 together with the second sticky film 2a can be exposed under an ultraviolet lamp 5, so as to reduce the stickiness of the second sticky film 2a (in this operation, the second sticky film 2a would face upwardly, whereas the dies would face downwardly). Finally, a stripper 7 is employed to strip the second sticky film 2a from the good or complete dies 11 to have them sequentially placed onto the troughs 61 of the carrier 6 or other carrying means.

The following will illustrate the first method of the present invention for a wafer with slight defects (such as a broken wafer) in more detail, wherein the stripper 7 will be replaced by a sucker 8, as shown in FIG. 3. First, the back of the defective wafer 1 is attached with a first sticky film 2. Then, a dicer 3 is employed to perform horizontal and vertical cutting on the front of the defective wafer 1 so as to create a plurality of separate dies 11. Next, the front of the defective wafer 1 is attached with a second sticky film 2a and then the defective wafer 1 together with sticky films is turned over, after which the first sticky film 2 attached to the back of the defective wafer 1 can be removed. Thereafter, according to the requirement of a specification, the backs of the dies 11 are grinded by a grinder 4 to allow each die to have a predetermined thickness. After finishing the grinding, the back of the wafer 1 is attached with a third sticky film, and then the second sticky film 2a attached to the front of the wafer 1 can be removed. Thereafter, the dies 11 together with the third sticky film 2b can be exposed under an ultraviolet lamp 5, so as to reduce the stickiness of the third sticky film 2b (in this operation, the third sticky film 2b would face upwardly, whereas the dies would face downwardly). Finally, a sucker 8 is employed to take the third sticky film 2b away from the good or complete dies 11 to have them sequentially placed onto the troughs 61 of the carrier 6 or other carrying means.

Figure 4:
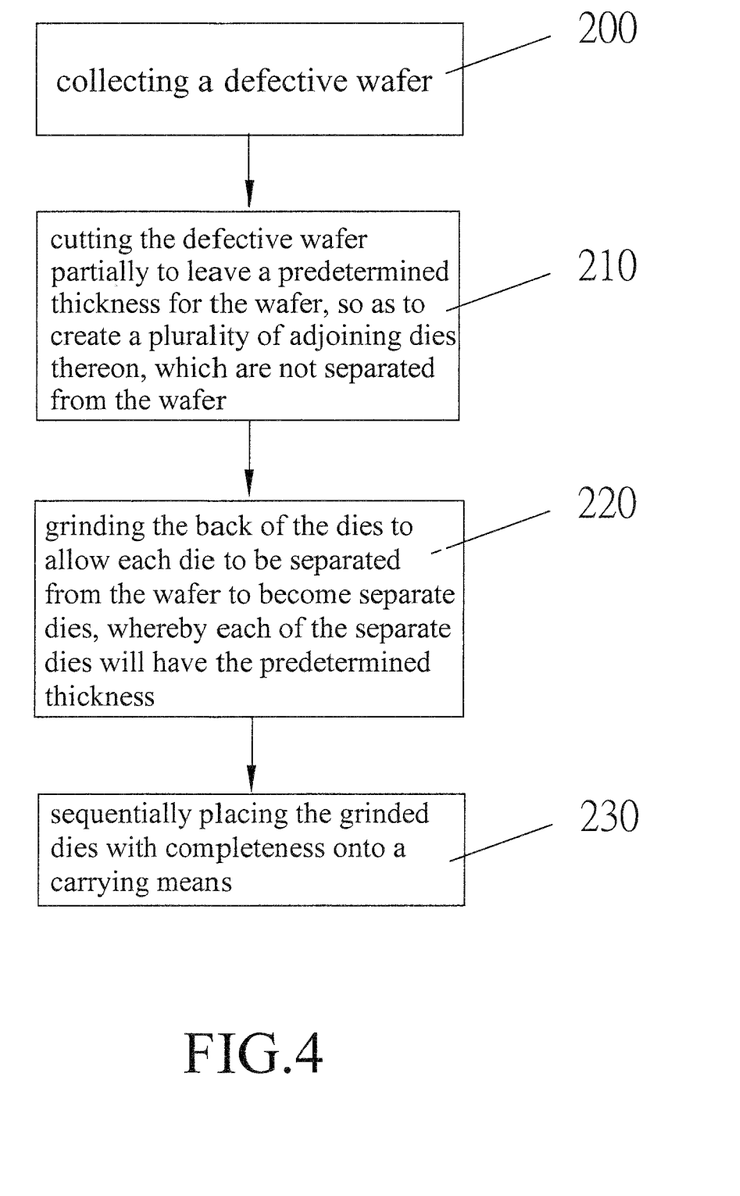
FIG. 4 shows a flowchart of the present invention, which briefs a second method of processing wafers for saving material and protecting environment.
Figure 5:
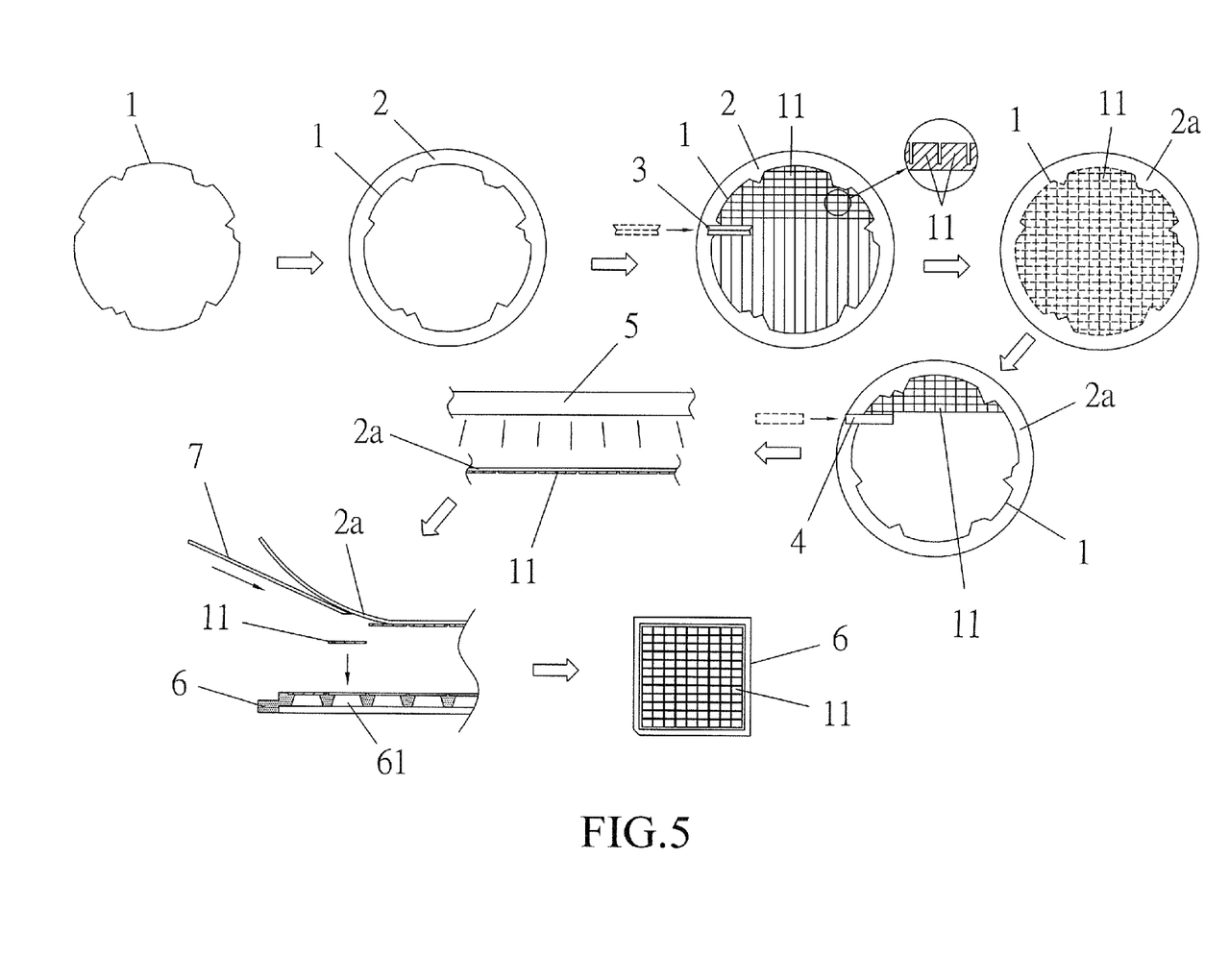
FIG. 5 shows a schematic view illustrating the flowchart in FIG. 4.
Figure 6:
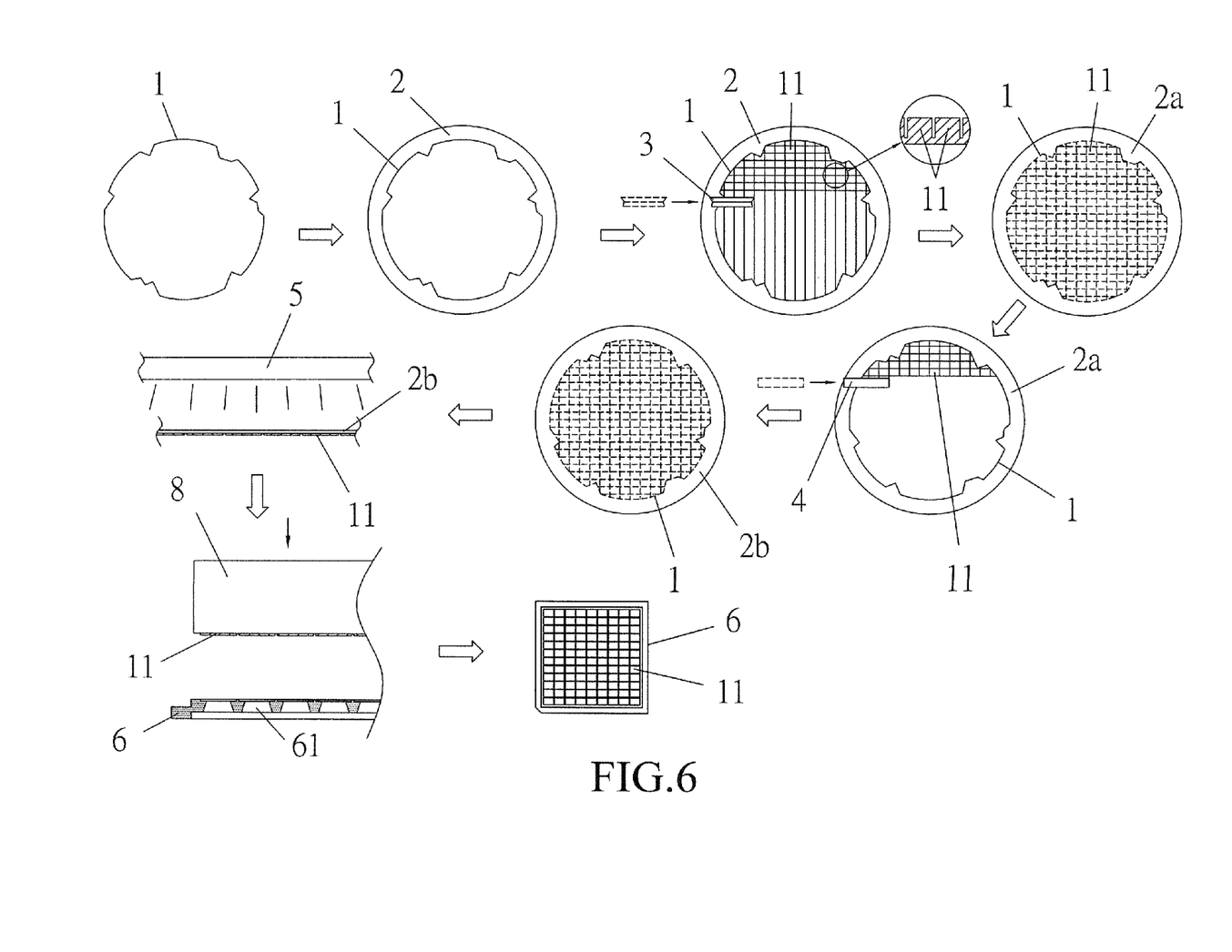
FIG. 6 shows another schematic view illustrating the flowchart in FIG. 4.

Referring to FIGS. 4-6, the present invention discloses a second method of processing wafers for saving material and protecting environment, which generally comprises the following steps:

STEP 200: collecting a wafer 1 which has defects, such as slight breakage or fragmentation, or low yield;

STEP 210: cutting the defective wafer 1 partially to leave a predetermined thickness for the wafer, so as to create a plurality of adjoining dies 11 thereon, which are not separated from the wafer;

STEP 220: grinding the back of the dies to allow each die to be separated from the wafer to become separate dies, whereby each of the separate dies will have the predetermined thickness rendered in the previous step; and STEP 230: sequentially placing the grinded dies with completeness onto a carrying means, such as a carrier 6 with troughs 61.

With the second method of the present invention, the defective wafers 1, which would be discarded in general wafer manufacturing, may be reclaimed to go through a cutting step (as provided by STEP 210), a grinding step (as provided by STEP 220), and a selecting step (as provided by STEP 230), to allow the dies 11 with completeness on the defective wafer 1 to be picked out and processed again, so as to increase the yield, lower the manufacturing cost, reduce the amount of the wafer waste, and meet the demands of energy saving, carbon reduction, and environmental protection.

The following will illustrate the second method for a wafer with slight defects (such as a broken wafer) in more detail. First, as shown in FIG. 5, the back of the defective wafer 1 is attached with a first sticky film 2. Then, a dicer 3 is employed to perform partially horizontal and vertical cutting on the front of the defective wafer 1 to leave a predetermined thickness for the wafer, so as to create a plurality of adjoining dies 11 on the wafer. Next, the front of the defective wafer 1 is attached with a second sticky film 2a, and then the defective wafer 1 together with the sticky films is turned over, after which the first sticky film 2 attached to the back of the defective wafer 1 can be removed. Thereafter, according to the requirement of a specification, the back of the dies 11 are grinded by a grinder 4 to allow each die to have the predetermined thickness rendered in the cutting operations. After finishing the grinding, the dies 11 together with the second sticky film 2a can be exposed under an ultraviolet lamp 5, so as to reduce the stickiness of the second sticky film 2a (in this operation, the second sticky film 2a would face upwardly, whereas the dies would face downwardly). Finally, a stripper 7 is employed to strip the second sticky film 2 from the good or complete dies 11 to have them sequentially placed onto the troughs 61 of the carrier 6 or other carrying means.

The following will illustrate the second method for a wafer with slight defects (such as a broken wafer) in more detail, wherein the stripper 7 will be replaced by a sucker 8, as shown in FIG. 6. First, the back of the defective wafer 1 is attached with a first sticky film 2. Then, a dicer 3 is employed to perform partially horizontal and vertical cutting on the front of the defective wafer 1 to leave a predetermined thickness for the wafer, so as to create a plurality of adjoining dies 11 on the wafer. Next, the front of the defective wafer 1 is attached with a second sticky film 2a, and then the defective wafer 1 together with the sticky films is turned over, after which the first sticky film 2 attached to the back of the defective wafer 1 can be removed. Thereafter, according to the requirement of a specification, the back of the dies 11 can be grinded by a grinder 4 to allow each die to have the predetermined thickness rendered in the cutting operations. After finishing the grinding, the back of the wafer 1 is attached with a third sticky film, and then the second sticky film 2a attached to the front of the wafer 1 can be removed. Thereafter, the dies 11 together with the third sticky film 2b can be exposed under an ultraviolet lamp 5, so as to reduce the stickiness of the third sticky film 2b (in this operation, the third sticky film 2b would face upwardly, whereas the dies would face downwardly). Finally, a sucker 8 is employed to take the third sticky film 2b away from the good or complete dies 11 to have them sequentially placed onto the troughs 61 of the carrier 6 or other carrying means.

Figure 7:
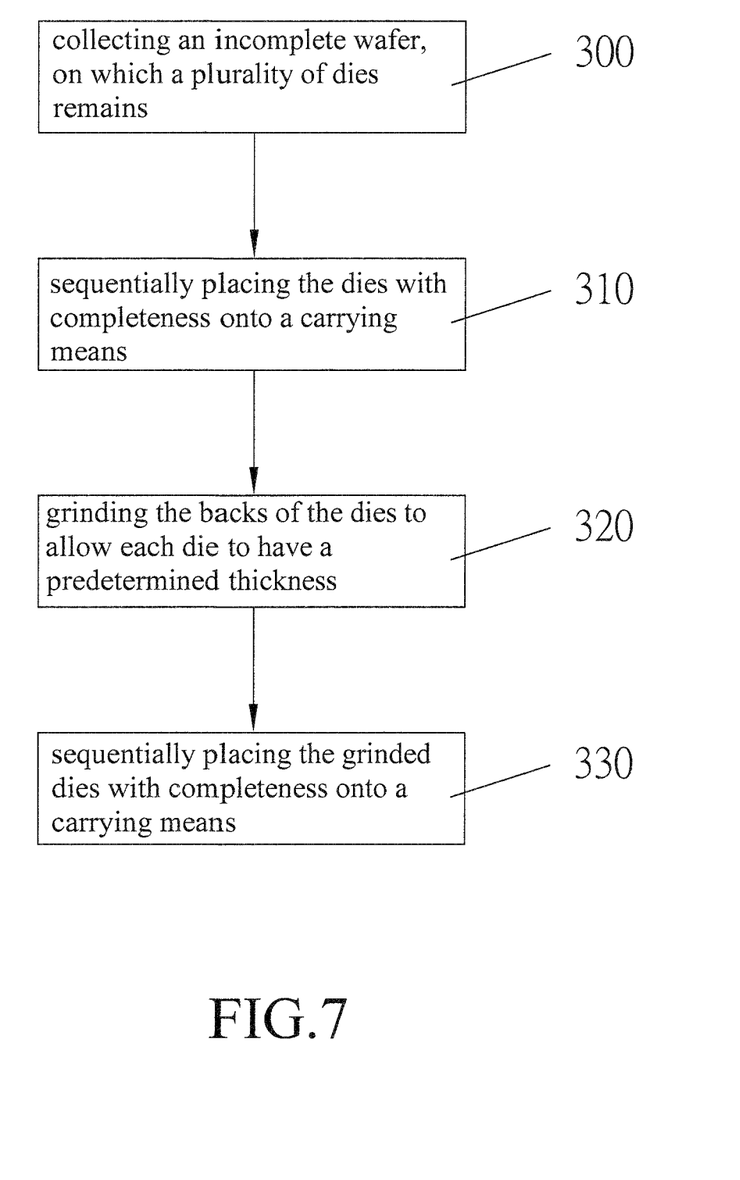
FIG. 7 shows a flowchart of the present invention, which illustrates a third method of processing wafers for saving material and protecting environment.
Figure 8:
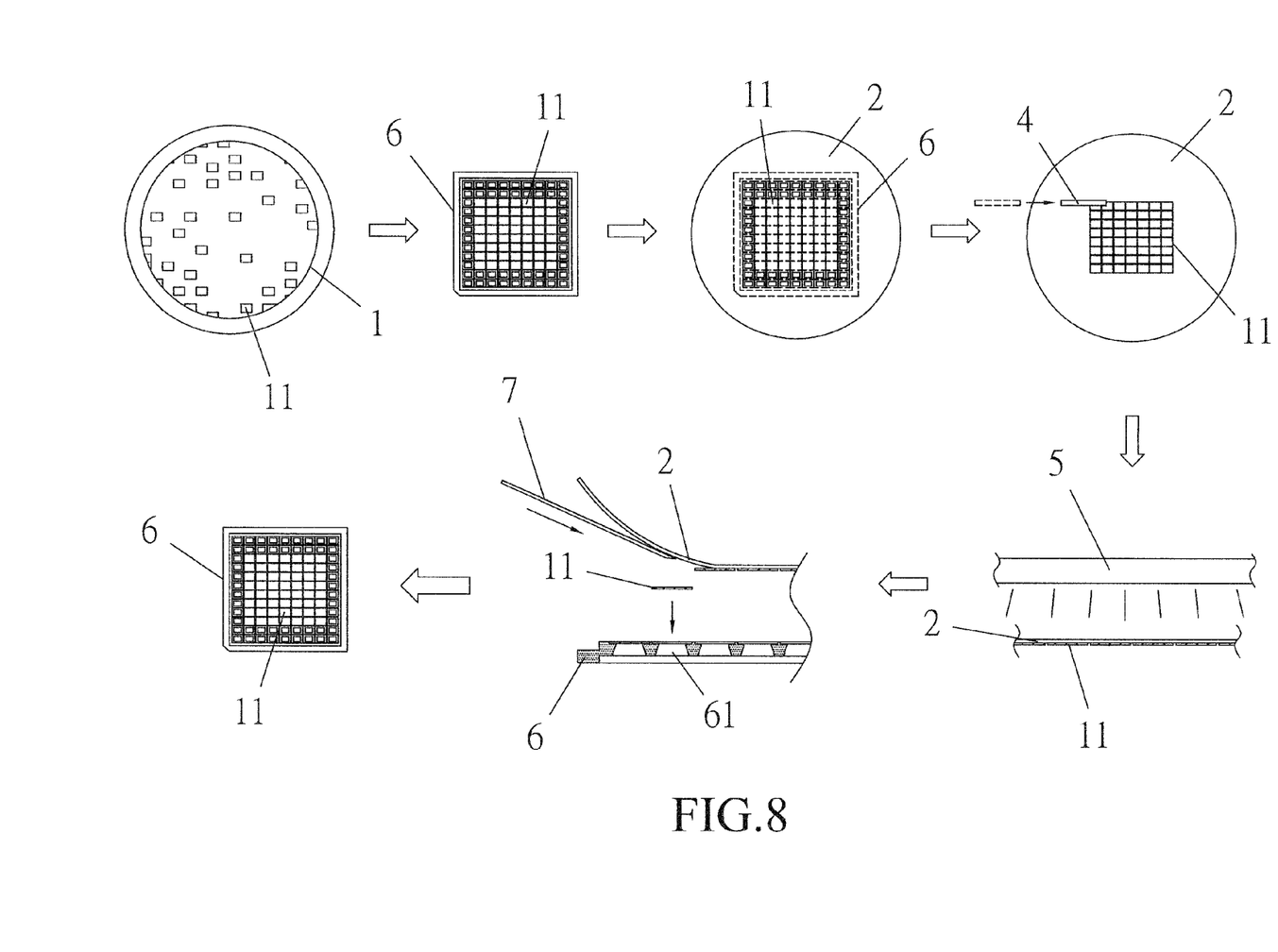
FIG. 8 shows a schematic view illustrating the flowchart in FIG. 7.
Figure 9:
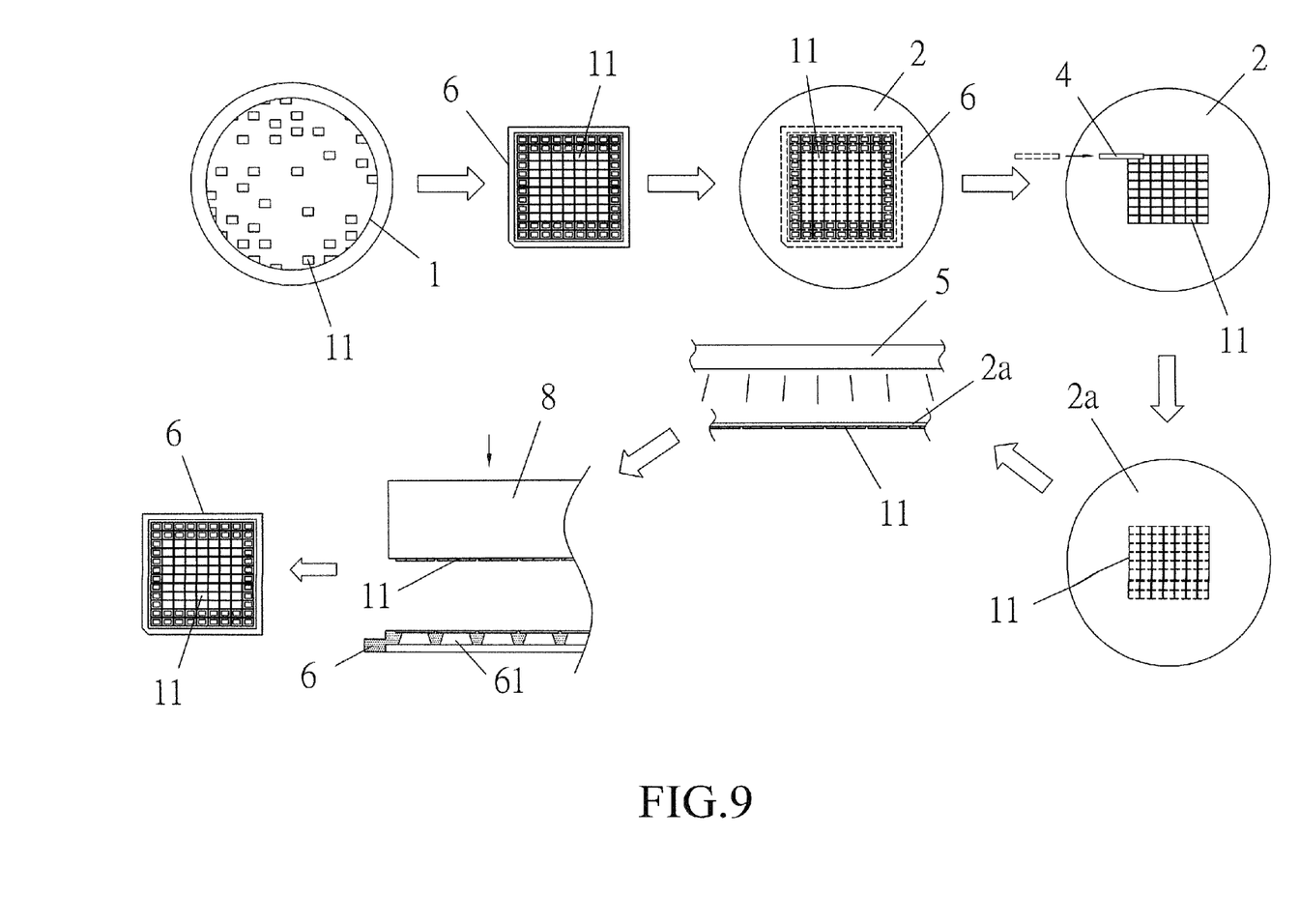
FIG. 9 shows another schematic view illustrating the flowchart in FIG. 7.

Referring to FIGS. 7-9, the present invention discloses a third method of processing wafers for saving material and protecting environment, which generally comprises the following steps:

STEP 300: collecting an incomplete wafer, on which a plurality of dies 11 remains or some dies of which are too thick;

STEP 310: sequentially placing the dies 11 with completeness onto a carrying means;

STEP 320: grinding the backs of the dies 11 to allow each die to have a predetermined thickness; and STEP 330: sequentially placing the grinded dies with completeness onto a carrying means, such as a carrier 6 with troughs 61.

With the third method of the present invention, the incomplete wafers 1, which would be discarded in general wafer manufacturing, may be reclaimed to go through a grinding step (as provided by STEP 320), and a selecting step (as provided by STEP 330), to allow the dies 11 with completeness on the incomplete wafer 1 to be picked out and processed again, so as to increase the yield, lower the manufacturing cost, reduce the amount of the wafer waste, and meet the demands of energy saving, carbon reduction, and environmental protection.

The following will illustrate the third method for an incomplete wafer 1, which contains a plurality of remaining dies or a plurality of dies having a too much thickness, in more detail. First, as shown in FIG. 8, the dies 11 with completeness are sequentially placed onto a carrying means, such as a carrier or a sticky film. If the carrying means is a carrier 6, then the fronts of the complete dies 11 are attached with a sticky film 2, after which the dies 11 together with the sticky film 2 are turned over, so that the backs of the dies 11 would face upwardly. (If the carrying means is a sticky film, the dies 11 with completeness can be directly attached to a sticky film, wherein the backs of the dies face upwardly.) Next, according to the requirement of a specification, the backs of the dies 11 are grinded by a grinder 4 to allow each die to have a predetermined thickness. After finishing the grinding, the dies 11 together with the sticky film 2 are exposed under an ultraviolet lamp 5, so as to reduce the stickiness of the sticky film 2 (in this operation, the sticky film 2 would face upwardly, whereas the dies would face downwardly). Finally, a stripper 7 is employed to strip the sticky film 2 from the good or complete dies 11 to have them sequentially placed onto the troughs 61 of the carrier 6 or other carrying means.

The following will illustrate the third method for an incomplete wafer 1, which contains a plurality of remaining dies or a plurality of dies having a too much thickness, in more detail, wherein the stripper 7 will be replaced by a sucker 8, as shown in FIG. 9. First, the dies 11 with completeness are sequentially placed onto a carrying means, such as a carrier or a sticky film. If the carrying means is a carrier 6, then the fronts of the dies 11 are attached with a first sticky film 2. Thereafter, the dies together with the first sticky film 2 are turned over, so that the backs of the dies 11 would face upwardly. (If the carrying means is a sticky film, the dies 11 with completeness can be directly attached to a first sticky film, wherein the backs of the dies face upwardly.) Next, according to the requirement of a specification, the backs of the dies 11 are grinded by a grinder 4 to allow each die to have a predetermined thickness. After finishing the grinding, the backs of the dies 11 are attached with a second sticky film, and then the first sticky film 2 attached to the fronts of the dies 11 can be removed. Thereafter, the dies 11 together with the second sticky film 2a are exposed under an ultraviolet lamp 5, so as to reduce the stickiness of the second sticky film 2a (in this operation, the second sticky film 2a would face upwardly, whereas the dies would face downwardly). Finally, a sucker 8 is employed to take the second sticky film 2a away from the good or complete dies 11 to have them sequentially placed onto the trough 61 of the carrier 6 or other carrying means.

It is noted that the dies 11 and the sticky film 2 are not always required to be exposed under an ultraviolet lamp for reducing the stickiness of the sticky film 2. Whether the exposure operation is required depends on the characteristics of a sticky film. When using a sticky film with lower stickiness, the dies 11 and the sticky film 2 have no need to be exposed under an ultraviolet lamp. When using a sticky film with higher stickiness, the dies 11 and the sticky film 2 can be exposed under an ultraviolet lamp so as to reduce the stickiness of the sticky film 2, so that the sticky film 2 can be easily separated from the dies 11. Also, it is noted that the defective wafer 1 used in STEP 100 and STEP 200 can be a broken or fragmented wafer or a complete wafer.

Although the present invention has been described with a certain degree of particularity, it is understood that the present disclosure is made by way of example only and the combination and arrangement of parts may be resorted to without departing from the spirit and scope of the invention hereinafter claimed.

I claim:

1. A method of processing wafers for saving material and protecting environment, comprising the steps of:
    collecting a defective wafer;
    attaching a first sticky film to a back of the defective wafer;
    cutting said defective wafer into a plurality of separate dies;
    attaching a second sticky film to a front of the defective wafer so that the second sticky film is in direct contact engagement with the defective wafer and removing the first sticky film to expose backs of said separate dies;
    grinding the backs of said dies to allow each die to have a predetermined thickness;
    exposing said dies with the second sticky film attached thereto under an ultraviolet lamp to reduce stickiness of the second sticky film so as to help remove the second sticky film from the dies; and
    sequentially placing the grinded dies with completeness onto a carrying means.

2. A method of processing wafers for saving material and protecting environment as claimed in claim 1, wherein said defective wafer are cut into separate dies by using a dicer proceeding with cut in horizontal and vertical direction on a surface thereof.

3. A method of processing wafers for saving material and protecting environment as claimed in claim 1, wherein the backs of said dies are grinded by using a grinder to allow each die to have a predetermined thickness.

4. A method of processing wafers for saving material and protecting environment as claimed in claim 1, wherein said carrying means is a carrier defining a plurality of troughs, onto which the grinded dies with completeness can be sequentially placed.

5. A method of processing wafers for saving material and protecting environment as claimed in claim 1, wherein said defective wafer is slightly broken or fragmented in structure.

6. A method of processing wafers for saving material and protecting environment as claimed in claim 1, wherein said defective wafer is complete in structure.

7. A method of processing wafers for saving material and protecting environment, comprising the steps of:
   collecting a defective wafer;
   attaching a first sticky film to a back of the defective wafer;
   cutting said defective wafer partially to leave a predetermined thickness for said wafer, so as to create a plurality of adjoining dies thereon, which are not separated from said wafer;
   attaching a second sticky film to a front of the defective wafer so that the second sticky film is in direct contact engagement with the defective wafer and removing the first sticky film to expose back of said adjoining dies;
   grinding the back of said adjoining dies to allow each die to be separated from said wafer to become a plurality of separate dies, whereby each of said separate dies will have the predetermined thickness;
   exposing said dies with the second sticky film attached thereto under an ultraviolet lamp to reduce stickiness of the second sticky film so as to help remove the second sticky film from the dies; and
   sequentially placing the grinded dies with completeness onto a carrying means.

8. A method of processing wafers for saving material and protecting environment as claimed in claim 7, wherein said defective wafer are partially cut in horizontal and vertical direction on a surface thereof by using a dicer.

9. A method of processing wafers for saving material and protecting environment as claimed in claim 7, wherein the back of said dies is grinded by using a grinder to allow each die to have the predetermined thickness.

10. A method of processing wafers for saving material and protecting environment as claimed in claim 7, wherein said carrying means is a carrier defining a plurality of troughs, onto which the grinded dies with completeness can be sequentially placed.

11. A method of processing wafers for saving material and protecting environment as claimed in claim 7, wherein said defective wafer is slightly broken or fragmented in structure.

12. A method of processing wafers for saving material and protecting environment as claimed in claim 7, wherein said defective wafer is complete in structure.

13. A method of processing wafers for saving material and protecting environment, comprising the steps of:
   collecting an incomplete wafer, on which a plurality of dies remains;
   sequentially placing the dies with completeness onto a carrying means;
   attaching a sticky film to fronts of the sequentially placed dies so as to be in direct contact with the fronts of the dies;
   grinding backs of said dies to allow each die to have a predetermined thickness;
   exposing said dies with the sticky film attached to the fronts thereof under an ultraviolet lamp to reduce stickiness of the sticky film so as to help remove the second sticky film from the fronts of the dies; and
   sequentially placing the grinded dies with completeness onto a carrying means.

14. A method of processing wafers for saving material and protecting environment as claimed in claim 13, wherein the backs of said dies are grinded by using a grinder to allow each die to have a predetermined thickness.

15. A method of processing wafers for saving material and protecting environment as claimed in claim 13, wherein said carrying means is a carrier defining a plurality of troughs, onto which the grinded dies with completeness can be sequentially placed.

16. A method of processing wafers for saving material and protecting environment, comprising the steps of:
   collecting an incomplete wafer, which contains some dies having a too much thickness;
   sequentially placing the dies with completeness onto a carrying means;
   attaching a sticky film to fronts of the sequentially placed dies so as to be in direct contact with the fronts of the dies;
   grinding backs of said dies to allow each die to have a predetermined thickness;
   exposing said dies with the sticky film attached to the fronts thereof under an ultraviolet lamp to reduce stickiness of the sticky film so as to help remove the second sticky film from the fronts of the dies; and
   sequentially placing the grinded dies with completeness onto a carrying means.

17. A method of processing wafers for saving material and protecting environment as claimed in claim 16, wherein the backs of said dies are grinded by using a grinder to allow each die to have a predetermined thickness.

18. A method of processing wafers for saving material and protecting environment as claimed in claim 16, wherein said carrying means is a carrier defining a plurality of troughs, onto which the grinded dies with completeness can be sequentially placed.

* * * * *